United States Patent
Ono et al.

(10) Patent No.: US 7,645,625 B2
(45) Date of Patent: Jan. 12, 2010

(54) METHOD FOR FINE PROCESSING OF SUBSTRATE, METHOD FOR FABRICATION OF SUBSTRATE, AND LIGHT EMITTING DEVICE

(75) Inventors: Yoshinobu Ono, Tsukubamirai (JP); Kenji Kasahara, Tsukuba (JP); Kazumasa Ueda, Tsuchiura (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 12/294,963

(22) PCT Filed: Mar. 30, 2007

(86) PCT No.: PCT/JP2007/057700

§ 371 (c)(1),
(2), (4) Date: Oct. 3, 2008

(87) PCT Pub. No.: WO2007/114503

PCT Pub. Date: Oct. 11, 2007

(65) Prior Publication Data

US 2009/0114944 A1    May 7, 2009

(30) Foreign Application Priority Data

Mar. 31, 2006    (JP) ............................. 2006-097930

(51) Int. Cl.
*H01L 21/00* (2006.01)
(52) U.S. Cl. ............................. 438/38; 438/46; 977/856
(58) Field of Classification Search ............... 438/38, 438/46; 977/856; 257/E33.028
See application file for complete search history.

(56) References Cited

U.S. PATENT DOCUMENTS

| | | | |
|---|---|---|---|
| 3,739,217 A | 6/1973 | Bergh et al. | |
| 4,407,695 A | 10/1983 | Deckman et al. | |
| 5,510,156 A | 4/1996 | Zhao | |
| 5,955,749 A | 9/1999 | Joannopoulos et al. | |
| 6,504,180 B1 | 1/2003 | Heremans et al. | |

(Continued)

FOREIGN PATENT DOCUMENTS

JP    S58-120255 A    7/1983

(Continued)

OTHER PUBLICATIONS

Windisch et al., "40% Efficient Thin-Film Surface-Textured Light-Emitting Diodes by Optimization of Natural Lithography," IEEE Transactions on Electron Devices, Jul. 2000, vol. 47, No. 7, pp. 1492-1498.

(Continued)

*Primary Examiner*—William M. Brewster
(74) *Attorney, Agent, or Firm*—Fitch, Even, Tabin & Flannery; Kendrew H. Colton

(57) ABSTRACT

The present invention provides a method for fine processing of a substrate, a method for fabrication of a substrate, and a light emitting device. In the method for fine processing of a substrate, after removing a single particle layer from the substrate having the single particle layer, a hole having an inner diameter smaller than a diameter of a particle and centering on a position on the substrate where each particle constructing the single particle layer has been placed is formed by etching.

27 Claims, 15 Drawing Sheets

U.S. PATENT DOCUMENTS

| | | |
|---|---|---|
| 7,029,592 B2 * | 4/2006 | Frendt .................. 216/42 |
| 2003/0173568 A1 | 9/2003 | Asakawa et al. |
| 2003/0178626 A1 | 9/2003 | Sugiyama et al. |
| 2005/0161696 A1 | 7/2005 | Yuri |
| 2007/0114511 A1 | 5/2007 | Kim et al. |

FOREIGN PATENT DOCUMENTS

| | | |
|---|---|---|
| JP | HP10-189601 A | 7/1998 |
| JP | 2003-218383 A | 7/2003 |
| JP | 2004-273289 A | 9/2004 |
| JP | 2005-064113 A | 3/2005 |
| JP | 2005-117006 A | 4/2005 |
| JP | 2005-244201 A | 9/2006 |

OTHER PUBLICATIONS

International Preliminary Report on Patentability, issued in PCT/JP2007/057700, dated Oct. 21, 2008.

* cited by examiner

METHOD FOR FINE PROCESSING OF SUBSTRATE, METHOD FOR FABRICATION OF SUBSTRATE, AND LIGHT EMITTING DEVICE

CROSS-REFERENCE TO RELATED APPLICATIONS

This application is the U.S. National Stage application from PCT application PCT/JP2007/057700, filed Mar. 30, 2007, and claims the benefit of foreign priority under 35 U.S.C. §119 based on Japanese application 2006-097930, filed Mar. 31, 2006, and the entire disclosures of the preceding applications are incorporated herein by reference.

TECHNICAL FIELD

The present invention relates to a method for fine processing of a substrate, method for fabrication of a substrate, and a light emitting device. More particularly, the present invention relates to a method for forming a fine hole on a substrate and a method for fabrication of a substrate. The present invention also relates to a light emitting device with an improved light output.

BACKGROUND ART

A light emitting device is widely used as a display or lighting. In recent years, the higher output of the light emitting device has been expected in terms of an improvement in the performance of the display or the like. To provide the higher output, an improvement in the light extraction efficiency of the light emitting device is required. In order to improve the light extraction efficiency, there is proposed, e.g., a method for forming roughness on the surface of the light emitting device instead of forming a planarized surface. With regard to the size of the roughness, it is known that the effect of a structure of a wavelength order is high, and the extraction efficiency is improved especially in a photonic crystal structure where a refractivity index is periodically changed by the roughness of the wavelength order (U.S. Pat. Specification No. 3,739,217, U.S. Pat. Specification No. 5,955,749). As a crystal structure where a two-dimensional photonic band gap is concurrently formed either in a TE mode or a TM mode, there is known a crystal structure of a circular-hole arrangement type. Conventionally, there has been known a method for forming the roughness using photolithography. However, it has been difficult to form fine roughness in the size of a visible light wavelength in accordance with this method. Consequently, X-ray exposure or electron beam exposure has been examined for the formation of the fine roughness. However, it is not practical to adopt the X-ray exposure or the electron beam exposure since a large size X-ray source facility is required in the X-ray exposure, and the electron beam exposure requires a very long period of time. Accordingly, as another method, there is proposed the formation of the fine roughness by performing etching using a nano-sized particle as a mask (U.S. Pat. Specification No. 4,407,695).

However, the size of the roughness depends on the size of the nano-sized particle in this method. To change the size of the roughness, the nano-sized particle needs to be changed, and therefore fine adjustment of the size of the roughness has been difficult. The configuration of the roughness to be formed is limited to a configuration where holes are formed in the gap between particles or a configuration where the portion immediately below a particle portion is left in a shape of a conical trapezoid. Therefore, the structure with a column arrangement type can be formed. However, the formation of the structure of the circular-hole arrangement type has been difficult.

DISCLOSURE OF THE INVENTION

An object of the present invention is to provide a method for forming fine roughness and a photonic crystal structure each of a circular-hole arrangement type in a large area in a required pattern region with excellent reproducibility.

Another object of the present invention is to provide a method for fabricating a substrate having the fine roughness and the photonic crystal structure each of the circular-hole arrangement type.

Still another object of the present invention is to provide a light emitting element having the fine roughness and the photonic crystal structure each of the circular-hole arrangement type.

The present inventors have achieved the present invention as a result of their dedicated study to solve the foregoing problem.

That is, the present invention provides a method for fine processing of a substrate in which, after removing a single particle layer from the substrate having the single particle layer, a hole having an inner diameter smaller than a diameter of a particle and centering on a position on the substrate where each particle constructing the single particle layer has been placed is formed by etching.

In addition, the present invention provides a method for fabrication of a substrate which includes the following steps (I) to (V) in this order;
(I) forming the single particle layer by arranging particles on the substrate;
(II) reducing the diameter of each of the particles by etching the obtained substrate;
(III) forming a thin film composed of a mask material on the obtained substrate;
(IV) removing the particle from the substrate and forming a mask having a hole with an inner diameter equivalent to the diameter of each of the particles at the position where the individual particle has existed; and
(V) forming a hole with a diameter equivalent to the inner diameter of the hole of the mask on the substrate below the hole of the mask by etching the substrate using the mask.

The present invention further provides a light emitting device composed of a nitride semiconductor and formed with fine holes in an entire surface or a partial region of a light extraction surface and/or an opposing surface.

DESCRIPTION OF REFERENCE NUMERALS

Figure 1:
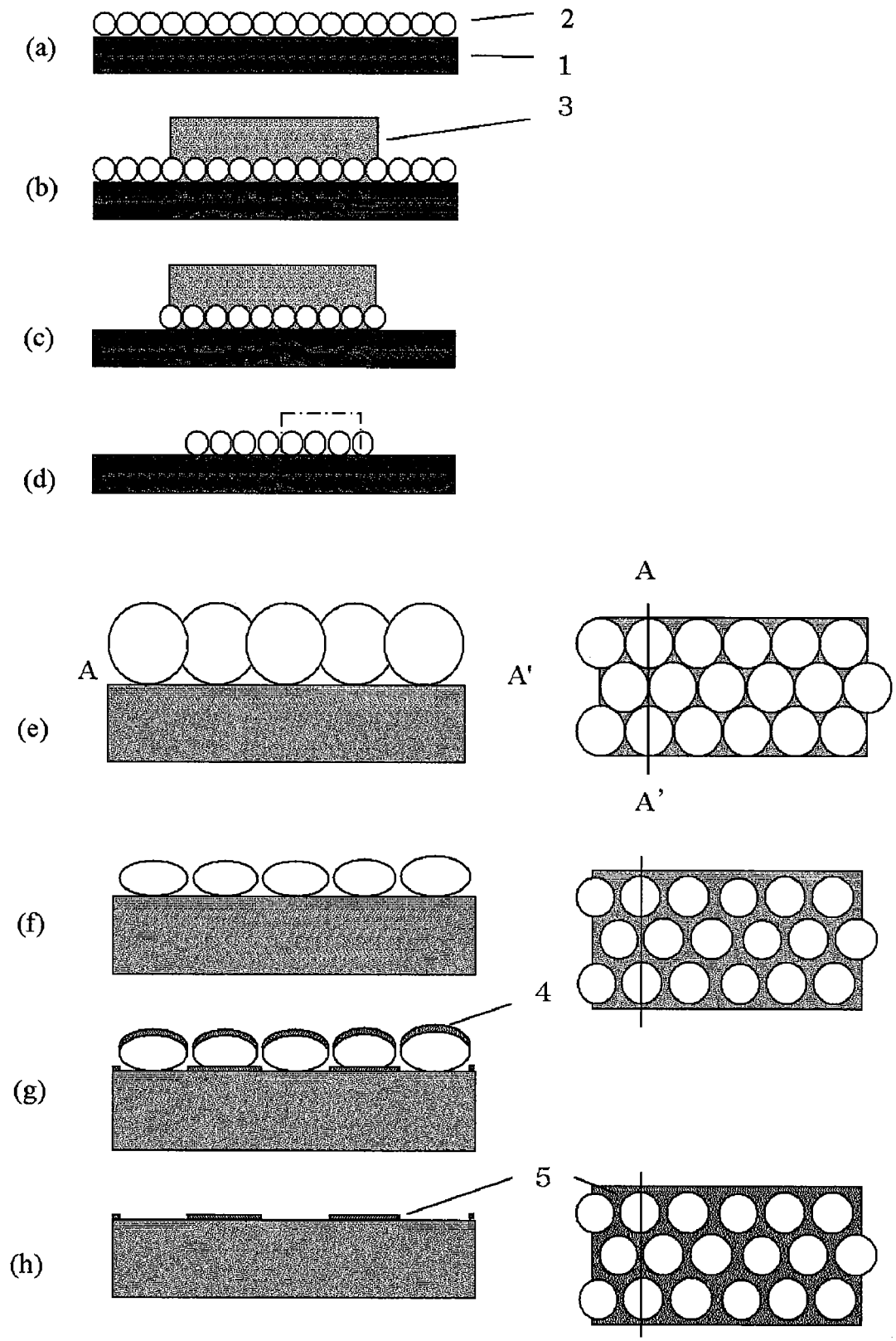
FIG. 1 schematically shows a process of the present invention.

1 . . . substrate
2 . . . single particle layer
3 . . . photo-resist
4 . . . mask material thin film
5 . . . mask for the second etching
6, 6' . . . circular hole
7 . . . substrate
8 . . . n-type layer
9 . . . light emitting layer
10 . . . p-type layer
11, 11' . . . transparent electrode
12 . . . second electrode
13 . . . structure with a circular-hole arrangement
14 . . . isolation boundary region
15 . . . insulating film
16 . . . conductive support substrate
17 . . . dielectric multi-layered film light reflection layer
18 . . . template for growth

MODE OF CARRYING OUT THE INVENTION

In a method for fine processing of a substrate according to the present invention, after removing a single particle layer from a substrate having the single particle layer, a hole having an inner diameter smaller than a diameter of a particle and centering on a position on the substrate where each particle constructing the single particle layer has been placed is formed by etching.

The method for the fine processing will be described with reference to FIG. 1. First, as shown in FIG. 1(*a*), a particle layer (a single particle layer) where particles are not overlapped on each other in a predetermined pattern is formed on a solid body as a substrate. The formation of the single particle layer having the pattern may be performed by, e.g., a method in which particles in an unnecessary portion are removed by photolithography after the single particle layer is formed on the entire substrate, a method in which the state of charges on an upper surface of the substrate is changed to be the configuration of the pattern and a particle dispersion liquid is spread thereon, or the like. In FIGS. 1(*b*) to 1(*d*), after the single particle layer is formed on the entire surface, the single particle layer in the predetermined pattern is formed by removing the particles in the unnecessary portion by photolithography. FIG. 1(*e*) shows a cross-sectional view and a plan view of the single particle layer formed on the substrate. As shown in FIG. 1(*f*), the diameter of each particle constructing the single particle layer is reduced by etching (hereinafter referred to as a first etching). In this example, the particle is fixed on the substrate and the diameter thereof is reduced without changing the central position thereof. In the case where the particles constructing the single particle layer have a two-dimensional closest packing structure, the diameter of each of the particles is reduced by the first etching, and a particle arrangement which is to be a base for the formation of a photonic crystal structure where the particles are arranged to be spaced apart from each other at equal intervals is obtained. As shown in FIG. 1(*g*), a mask material thin film is formed on the entire substrate. As shown in FIG. 1(*h*), when the particle with the reduced diameter is removed, a mask with holes each having its center at the same position as the center obtained when the particle (e.g., a sphere) constructing the single particle layer is projected, and each having the inner diameter equivalent to the diameter of the particle with the reduced diameter at each center is obtained. Finally, as shown in FIG. 1(*i*), by performing etching (hereinafter referred to as a second etching) using the mask, holes corresponding to the holes in the mask are formed on the substrate.

Next, a description will be given to a method for fabrication of a substrate in which the method for the fine processing described above is applied.

(Formation of Single Particle Layer)

A substrate may be any substrate as long as it is made of a solid body, and the substrate is made of, e.g., a semiconductor, a dielectric, a light-transmitting (conductive) material, and a metal. Examples of the substrate include a template, a semiconductor layer, and an electrode. The substrate is normally in the form of a plate. The substrate may have a configuration with a curved surface such as a sphere or a cylinder. The semiconductor includes semiconductors such as Si and Ge, compound semiconductors such as GaAs, InP and GaN, and alloy semiconductors such as InGaAlAs, InGaAlP, InGaAsP, and InGaAlN. The semiconductor is preferably a nitride semiconductor. The dielectric includes amorphous dielectrics such as $SiO_2$ and $SiN_2$, and a crystalline dielectric such as sapphire. The light-transmitting material has transparency to light in a wavelength range which is at least a part of the wavelength range from infrared rays to ultraviolet rays, and includes, e.g., ITO, ZnO, and $SnO_2$, among which ITO is preferable. The metal includes metals and magnetic metals such as Au, Al, and Cu. The substrate may be made of solely one of them, or a material obtained by laminating them (for example, a multi-layered body composed of the semiconductor and the light-transmitting (conductive) material laminated thereon, and a multi-layered body composed of the semiconductor and the metal laminated thereon).

The substrate preferably has high flatness in the region for the formation of the particle layer, and the surface flatness Ra is preferably not more than 20 nm.

When the substrate is made of ITO, ITO is preferably produced by a sputtering method or a facing target sputtering method rather than a vacuum evaporation method or an application method in terms of flatness. ITO produced by the facing target sputtering method exhibits excellent surface flatness and is preferable as a substrate. In addition, a plasma damage hardly occurs in the facing target sputtering method, ITO is preferable as an ohmic electrode used for the light emitting device or the like.

A particle may be made of either a organic or inorganic substance. The inorganic substance includes an oxide such as silica, alumina, zirconia, titania, ceria, zinc oxide, or tin oxide; a nitride such as silicon nitride, aluminum nitride, or boron nitride; a carbide such as SiC, boron carbide, diamond, graphite, or fullerenes; a boride such as $ZrB_2$ or $CrB_2$; a sulfide; and a metal such as gold, silver, platinum, palladium, copper, nickel, cobalt, or iron, among which the oxide is preferable, and silica is more preferable. The organic substance includes a styrene-based resin such as polystyrene; acrylic-based resin such as polymethyl methacrylate (PMMA); a polymer obtained by coordination polymerization such as polyethylene or polypropylene; a polymer obtained by condensation polymerization such as polycarbonate, polyamide (nylon 66 or the like), polyester, polyimide, polyphenylene ether, polyarylene sulfide, polyether-ketone, or polyetheretherketon; a polymer obtained by ring-opening polymerization such as nylon 6 or polycaprolactone; and an organic crystal such as a pigment, among which the styrene-based resin is preferable, and polystyrene is more preferable. Among them, the particle made of silica is preferable.

The particle has the configuration of a polyhedron, a sphere, or the like. In terms of control of the particle arrangement and closest packing, the configuration of the particle is preferably spherical. The particle may be any particle as long as it has a size in correspondence to a desired structure with a circular-hole arrangement. When the configuration of the particle is spherical, the particle normally has an average particle diameter (diameter) of not less than 10 nm and not more than 10 μm, preferably not less than 50 nm and not more than 1 μm. When the average particle diameter is not less than 10 nm, it becomes easy to control the particle arrangement. The particle may have either a sharp particle size distribution or a broad particle size distribution. In terms of formation of the single particle layer with ease, the particle size distribution is preferably sharp, and is more preferably monodispersed. In addition, the particles may be the mixture of monodispersed particles having different average particle diameters. For example, when the mixture of two types of particles having different average particle diameters is used, the particle having the smaller average particle diameter disappear in the first etching, and the particle having the larger average particle diameter is left. Thereafter, by performing the formation of the mask material thin film, the removal of the particle having the larger particle diameter, and the second etching, a circular hole is formed at the position where the particle having the larger average particle diameter has been present.

Formation may be performed by arranging particles on the substrate, and may be performed by, e.g., a advection and accumulation method, a dip-coating method, or a spin coating method. For example, when the single particle layer is formed by the methods described above using spherical particles of a single type, the single particle layer containing particles and having a thickness equivalent to the diameter of each of the particles in which the particles are arranged such that they do not vertically overlap each other is normally obtained. When the single particle layer is formed using particles of not less than two types having different average particle diameters, the single particle layer containing the particles and having a thickness equivalent to the diameter of the particles having the largest particle diameter in which the particles are arranged such that they do not vertically overlap each other is normally obtained. In the advection and accumulation method, after a dispersion liquid composed of a solvent and particles is spread on the substrate, when the solvent is evaporated while the evaporation rate is precisely controlled, the particles are advected and accumulated by the surface tension of the solvent. In the dip-coating method, after the substrate is immersed in a dispersion liquid composed of a solvent and particles, the substrate is pulled out at an appropriate speed. In the spin coating method, a dispersion liquid composed of a solvent and particles is spread on a rotating substrate.

(First Etching)

A first etching may be performed under a condition that the particle diameter is reduced without changing the position of each particle constructing the particle layer on the substrate. In the first etching, the portion of the substrate exposed through the gap between particles may be etched while at the same time the particles themselves are etched. The first etching is preferably performed under a condition that a selectivity (=etching rate for particle/etching rate for substrate) is not less than 1, preferably not less than 2. The higher selectivity is preferable since the etched portion of the substrate is smaller and therefore the flatness is retained. A first etching gas may be any gas capable of reducing the particle diameter of the particle, and examples of the first etching gas include a gas containing fluorine such as $CF_4$, $CHF_3$, $C_2H_2F_2$, or $C_2F_3Cl_3$, and a gas containing oxygen. In the case where the particle is made of an oxide (silica or the like), when the gas containing fluorine is used as the etching gas, the etching rate for the particle becomes high. On the other hand, in the case where the particle is made of a polymeric material (polystyrene latex or the like), when the gas containing oxygen is used, the etching rate for the particle becomes high. When the etching rate for the particle is high, the choice of the substrate material becomes wider, and the range of application becomes wider as well. For example, in the case where the particle is made of silica and the substrate is made of the nitride semiconductor or an ITO thin film, the first etching gas is preferably the fluorine-containing gas. In the case where the particle is made of the polymer, and the substrate is made of the metal or ITO, the first etching gas is preferably the oxygen-containing gas.

The first etching may be either an etching with high anisotropy or an isotropic etching. The anisotropic etching is preferable since etching in a lateral direction hardly progresses so that the particle diameter is reduced while the particle is flattened. A change in the particle diameter with time is not proportional to an etching time, and the speed of the reduction in the particle diameter progressively becomes faster with time. Therefore, in terms of controllability, it is preferable to determine an inspection line for the etching time and etching depth in advance before the etching is performed. In addition, by controlling an etching pressure, an etch rate in the lateral direction can be increased. By performing etching on these conditions, the effect equivalent to that of the isotropic etching is exhibited. This allows the speed of the reduction in the particle diameter to be increased and the degree of the flattening to be small so that the particle removal performed in a subsequent step is facilitated.

In the first etching, it is preferable to reduce the diameter of the particle to not less than 10% and not more than 95% of the particle diameter before the etching.

(Formation of Mask)

A mask may be made of any material as long as it is resistant to a chemical solution used for the particle removal in a subsequent step, and exhibits the effect as a mask in the second etching in the subsequent step. For example, in the case where the etching gas is composed of a chlorine-based gas or a fluorine-based gas, the mask is preferably made of transition metals since the vapor pressure of the chloride or the fluoride is small. Ni is more preferable since the etching rate therefor is low. When the substrate is made of a metal material or a magnetic metal material, Ni is preferable since the etching rate therefor is low.

The formation of the mask is preferably performed by controlling conditions for the formation of the mask and a film thickness in order to facilitate the particle removal in the nest step. The thickness of the mask is preferably not more than 50% of the height of the particle with the diameter reduced by the first etching in terms of the prevention of the coupling between the mask formed on the upper portion of the particle and the mask formed on the substrate. Further, the formation of the mask is preferably performed under a condition that the mask material collides with the substrate from a direction generally perpendicular to the substrate surface and is deposited thereon so that a shadow portion where the mask is not formed is formed at the lower side of the particle in terms of the prevention of the coupling between the mask deposited on the upper portion of the particle and the mask directly deposited on the substrate. The formation of the mask may be performed by, e.g., a vapor phase deposition method, a vacuum deposition method, an ion beam sputtering method, or a laser ablation method.

(Second Etching)

A second etching may be performed under a condition that a hole in correspondence to a hole of the mask is formed on the substrate formed with the mask. For example, when the substrate is made of the semiconductor (Si, GaN, InGaP, or the like), the dielectric ($SiO_2$, $SiN_2$, sapphire, or the like), or the light-transmitting conductive material (ITO or the like), the chlorine-based gas or the fluorine-based gas is used as the etching gas. The second etching is preferably performed under a condition that the selectivity (=etching rate for substrate/etching rate for mask) is not less than 1, preferably not less than 2.

(Particle Removal)

Particle removal may be performed by a method in which the particle is solved to be removed by a process using a chemical solution for solving the particle while at the same time the mask on the particle is removed (particle lift-off process). The particle removal may be performed by, for example, a method in which the particle is wet-etched, preferably a method in which wet etching excellent in particle solubility and poor in mask solubility is performed.

When the particle is made of silica, the removal may be performed by using an acid such as hydrofluoric acid or buffered hydrofluoric acid; or an alkaline liquid such as a sodium hydroxide aqueous solution or an tetramethyl ammonium hydroxide aqueous solution. When the particle is made of silica and the mask is made of Ni, the alkaline liquid having a pH of not less than 12 is preferably used.

The particle removal is preferably performed at not less than 50° C. In addition, in terms of an improvement in particle lift-off property, an ultrasonic process is preferably used in combination.

On the other hand, when the particle is made of the polymeric material and the mask is made of the metal, an organic solvent is preferably used as an etching liquid.

In accordance with the method of fine processing thus described, a large number of fine holes can be formed in a template, a semiconductor layer, a substrate such as an electrode, or a multi-layered substrate. For example, when a substrate obtained by laminating, on a bulk solid body, a thin film made of another material (a structure in which a transparent conductive electrode is formed on a compound semiconductor) is processed, holes extending through the transparent conductive electrode and reaching the inside of the compound semiconductor located below can be formed.

In accordance with the method, a roughness structure with the circular-hole arrangement can be formed on the surfaces of various solid materials. Accordingly, the roughness can be formed not only on the surfaces of the semiconductor and the electrode but also on an additional layer such as a protection layer or the like.

Further, in accordance with the method, the structure with the circular-hole arrangement is formed based on the particle arrangement of the single particle layer so that, by adjusting conditions of the particle arrangement of the single particle layer, various arrangement states such as a so-called two-dimensional photonic crystal structure having substantially perfect regularity, a particle arrangement having a lattice defect therein, an mixed arrangement having a closest packing region and a region with low particle density, a structure where particles are arranged at random, and the like are obtainable. By forming the light emitting device with the roughness formed from the various arrangement states, the light emitting device with an improved light extraction efficiency can be obtained.

In addition, in accordance with the method, the structure with the circular-hole arrangement can be formed on a template for crystal growth. In this case, in order to prevent a hole from being filled by lateral growth at the time of crystal regrowth, an oxide thin film such as $SiO_2$ or the like having a function of inhibiting the growth may be formed in the inside or on the sidewall of the circular hole.

Light Emitting Device

A light emitting device according to the present invention is a light emitting device made of a nitride semiconductor and fine holes are formed in an entire surface or in a partial region of a light extraction surface and/or an opposing surface. The light emitting device will be described with reference to the drawings. FIGS. 2 to 8 show examples of the light emitting device in which a roughness structure with a circular-hole arrangement is formed.

Figure 2:
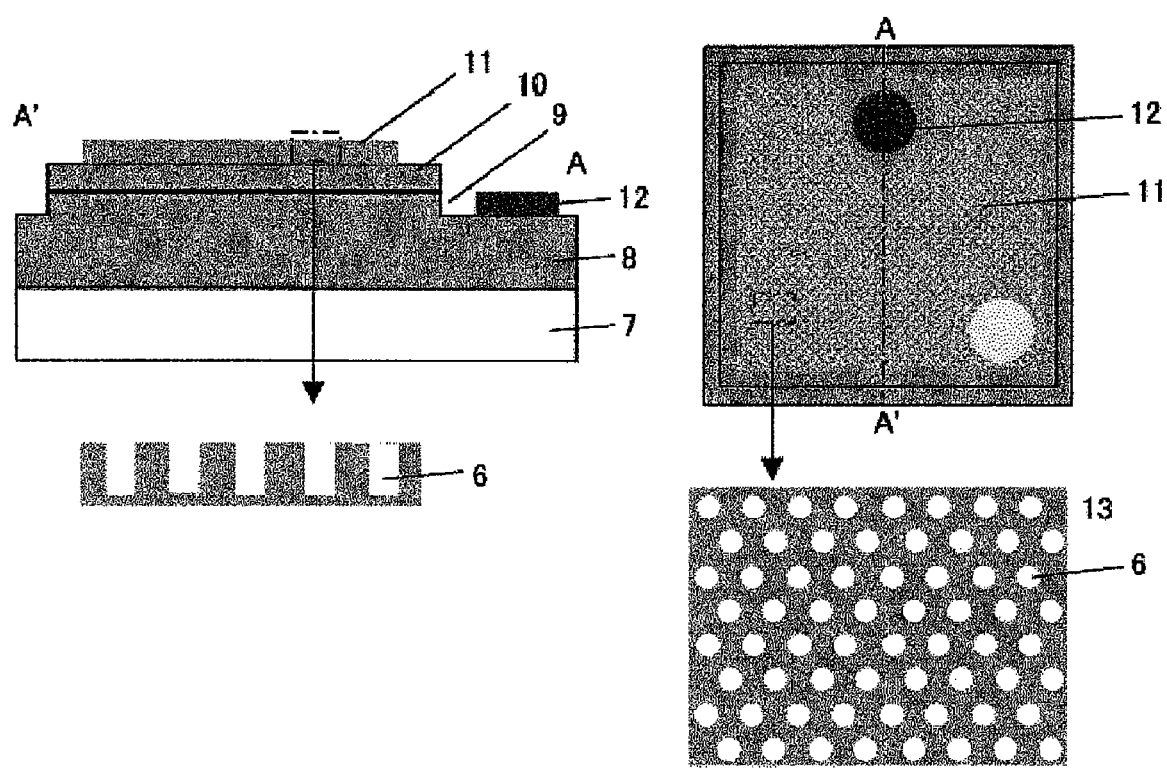
FIG. 2 shows a structure of a light emitting device according to the present invention.

FIG. 2 has a plan view and a cross-sectional view of the light emitting device in which the roughness structure with the circular-hole arrangement is formed in the inside of a translucent electrode pattern on the side of the light extraction surface. The transparent electrode pattern is formed on a p-layer side as the light extraction surface and the roughness structure is formed in the inside of the transparent electrode pattern. The light emitting device is excellent in light extraction efficiency.

Figure 3:
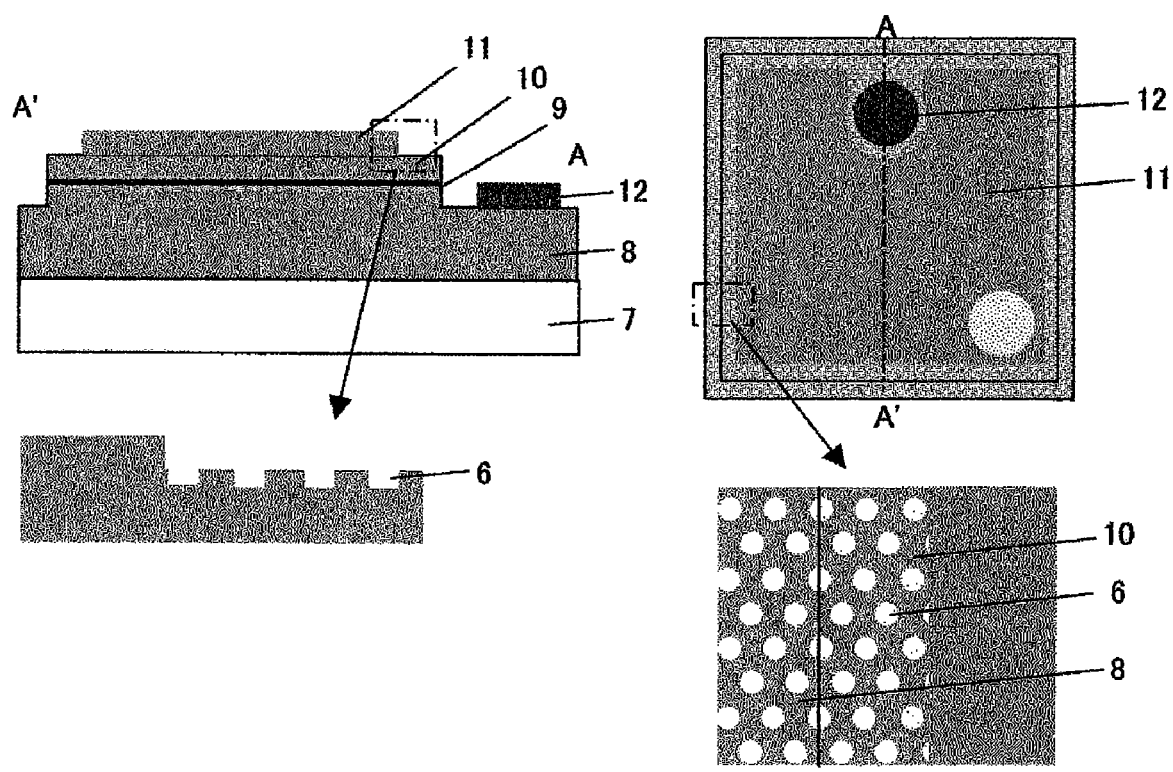
FIG. 3 shows a structure of a light emitting device according to the present invention.
Figure 4:
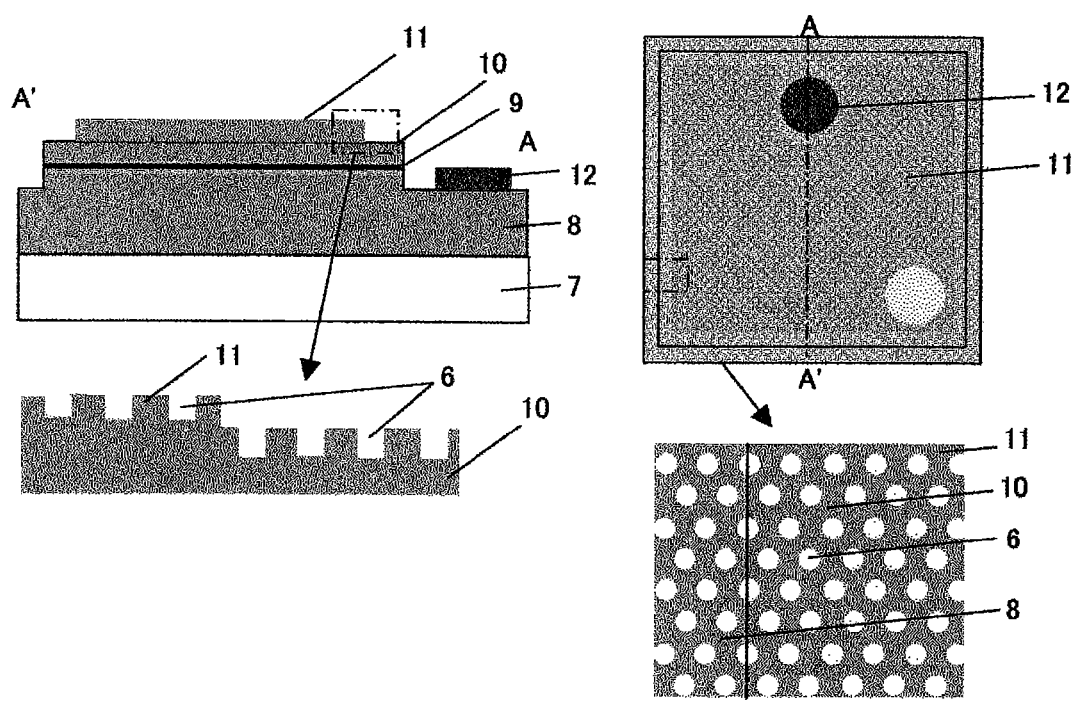
FIG. 4 shows a structure of a light emitting device according to the present invention.

FIGS. 3 and 4 respectively show an example of the formation outside the translucent electrode pattern and an example of the formation on the entire surface on the light extraction surface side. The portion for the formation of the roughness may be either the entire light extraction surface or a partial portion thereof.

Figure 5:
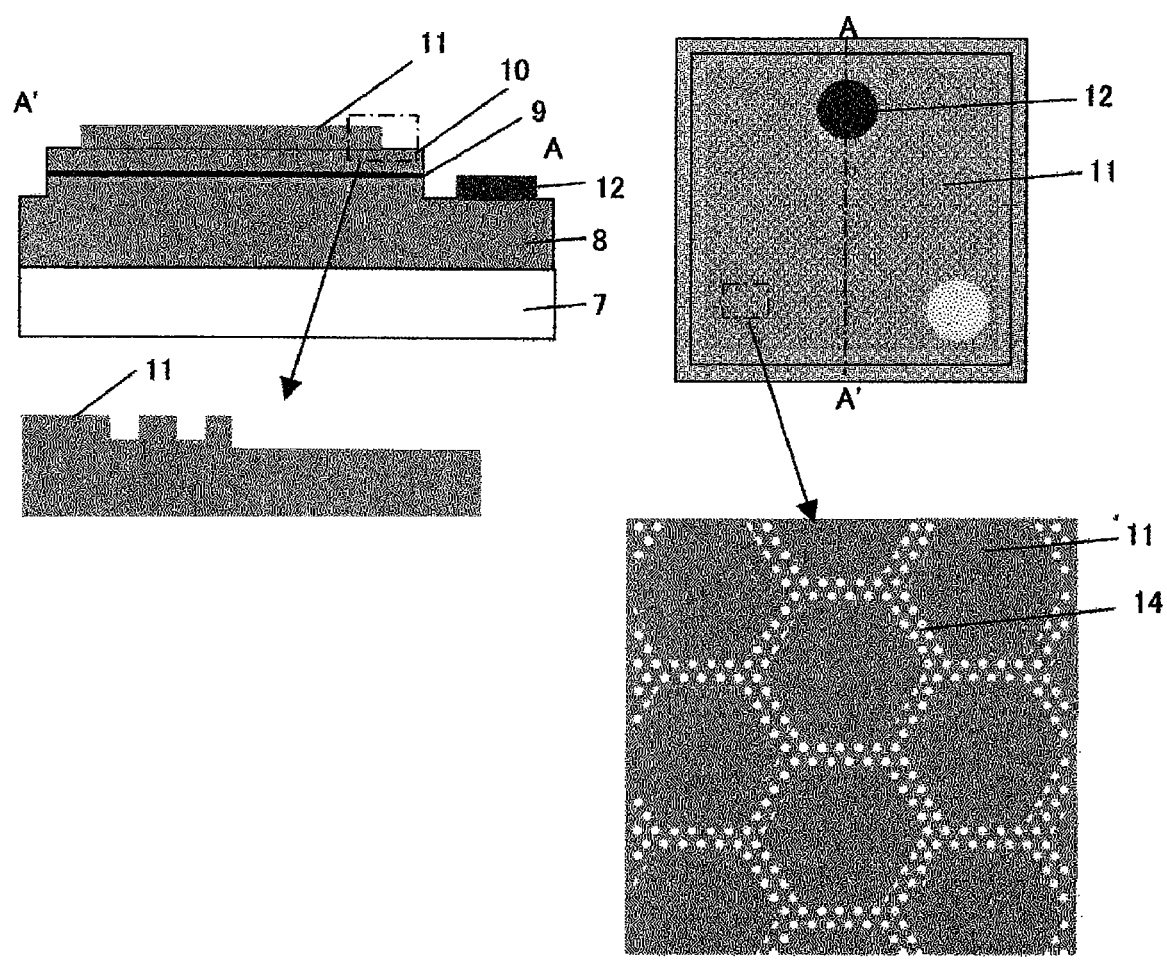
FIG. 5 shows a structure of a light emitting device according to the present invention.

FIG. 5 shows an example in which the light extraction surface is separated into minute regions and the structure with the circular-hole arrangement is formed in the boundary region of the minute regions, which is another example of the formation of the roughness in the partial portion of the light extraction surface. Although the configuration of each of the minute region is hexagonal in FIG. 5, the configuration thereof may be triangular, quadrangular, circular, or indefinite. The structure having such a separation boundary provides excellent extraction efficiency.

Figure 6:
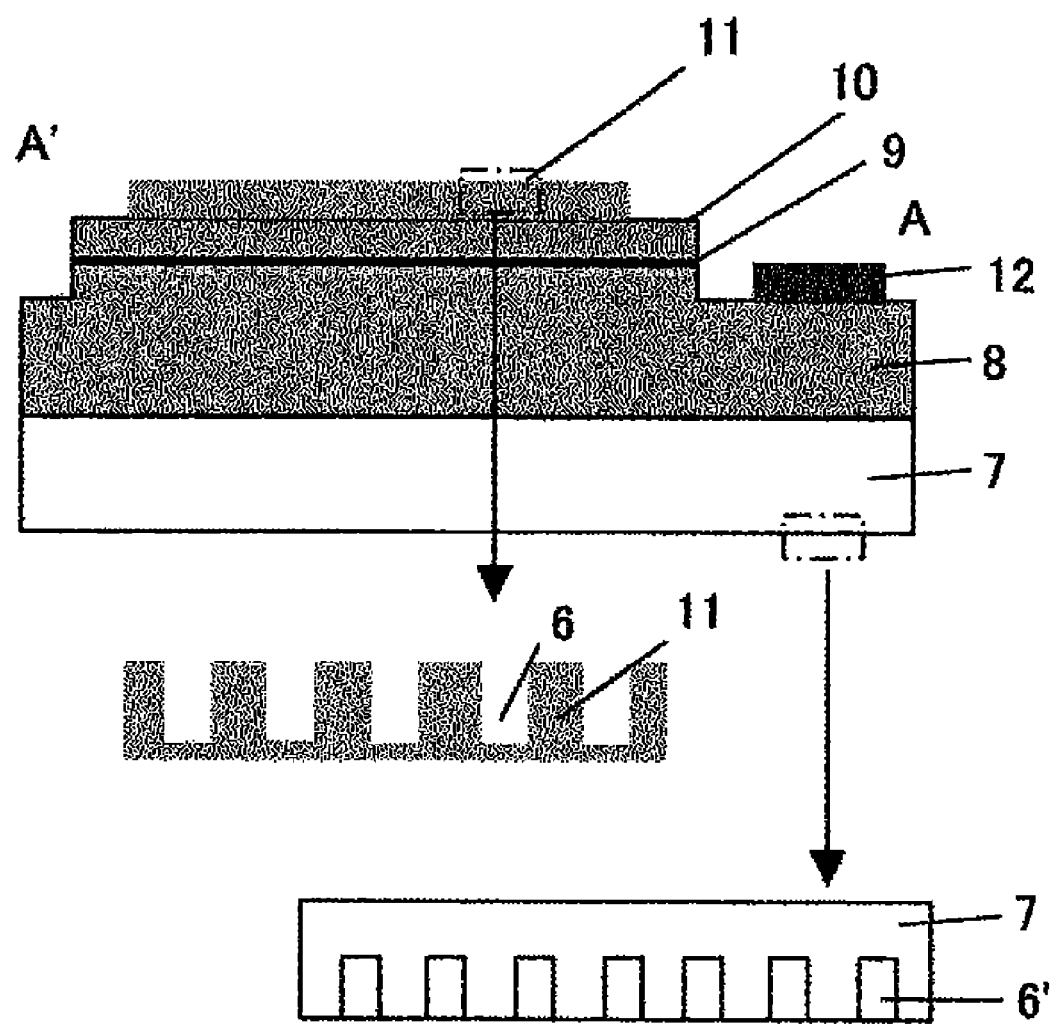
FIG. 6 shows a structure of a light emitting device according to the present invention.

The light emitting device may have the roughness formed not only on the light extraction surface as in the examples described above but also on the side of the back surface (opposing surface) thereof. The light extraction efficiency is improved in this case as well. FIG. 6 shows an example in which fine roughness is formed on a sapphire surface on the side of the opposing surface of the light emitting device shown in FIG. 2. Each of the device structures shown in FIGS.

3 to 5 may also have the roughness formed on the side of the opposing surface in the same manner. The light extraction efficiency is improved in each case.

Figure 7:
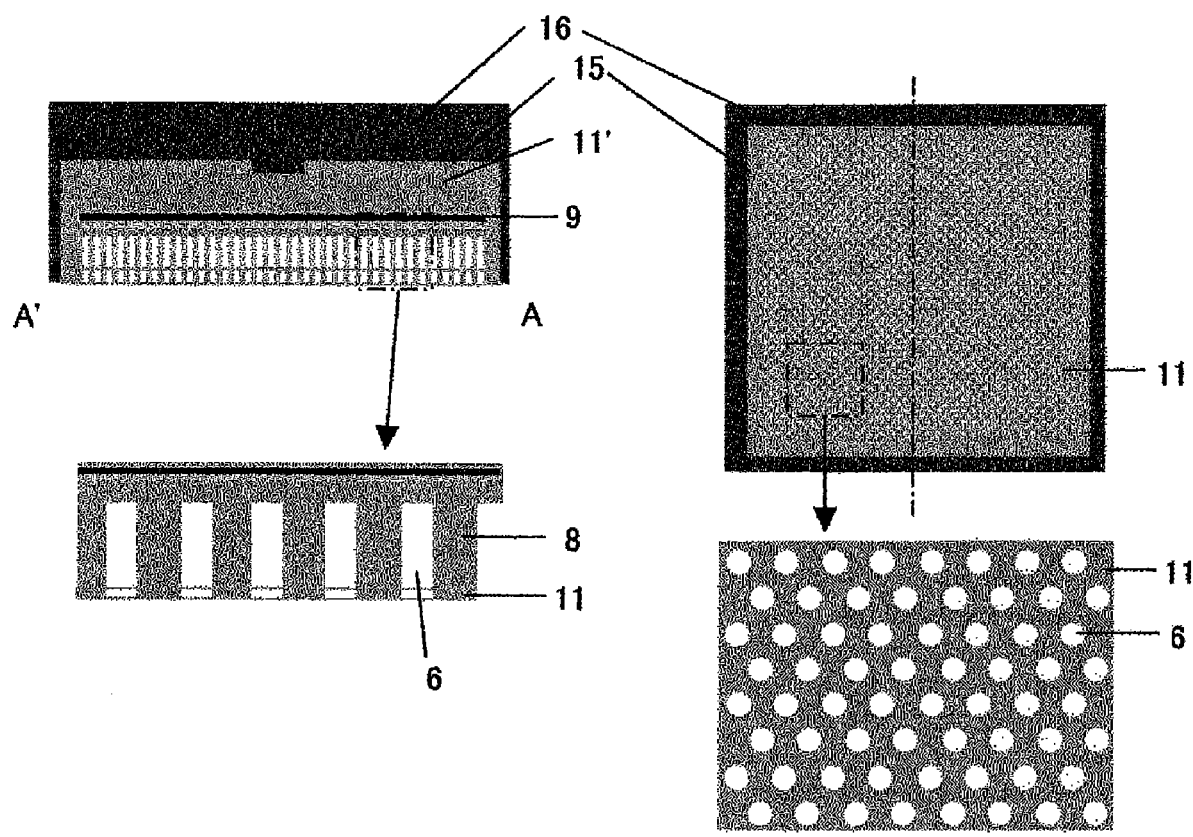
FIG. 7 shows a structure of a light emitting device according to the present invention.

FIG. 7 shows a device with a structure in which light is extracted from a delamination surface side obtained by delaminating a growth substrate of a nitride semiconductor light emitting device and forming a deep structure with the circular-hole arrangement in the delamination surface. In this case, a conductive support substrate is formed to provide mechanical strength before the delamination of the grown substrate, and an electrode is formed on each of upper and lower surfaces.

The light emitting device having this type of the roughness structure may be formed in accordance with the method for fabrication of the substrate described above. To prevent a damage to the light emitting layer resulting from etching, the depth of the hole preferably does not reach the light emitting layer and is as close to the light emitting layer as possible. Since a substrate with large lattice misfit is generally used as the growth substrate in the nitride semiconductor, a base layer of about 3 to 4 μm is usually grown and a device layer functioning as the light emitting device is grown thereon in order to improve the crystal quality. Normally, this layer remains after the delamination of the growth substrate, and by forming the structure with deep holes in this portion, guided light in a lateral direction is sufficiently reduced and the proportion of light propagating in a vertical direction is increased so that the light extraction efficiency is improved. In addition, when high aspect ratio is required, after reducing the thickness of the entire delamination surface to be a thin film by etching, the structure with the circular-hole arrangement having high aspect ratio may be formed. Further, a hole having a depth extending through multiple layers in the device structure may be formed. By deepening the hole formed in the transparent electrode in FIG. 2, a hole reaching the GaN layer located thereunder may be formed. This deep circular-hole structure is preferable since it has high effect of an improvement in light extraction efficiency.

Figure 8:
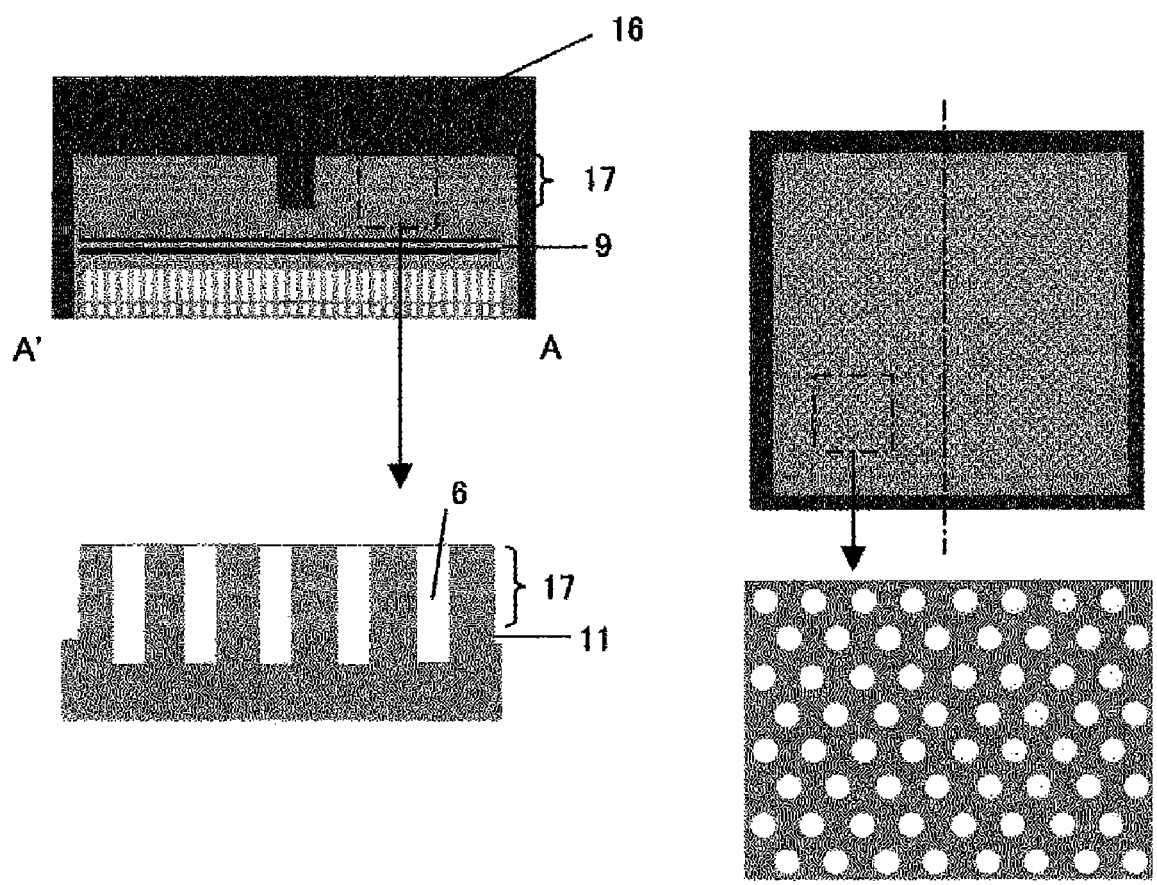
FIG. 8 shows a structure of a light emitting device according to the present invention.

In addition, as shown in FIG. 8, the roughness structure with the circular-hole arrangement which extends through a multiple film and reaches the nitride semiconductor may be formed with respect to the dielectric multi-layered film composed of $SiO_2/TiO_2$ formed on the opposing surface. In the light emitting device with this structure, since light traveling in the thickness direction in the inside of the fine structure of the circular-hole arrangement is substantially only the light in a direction perpendicular to the surface, the angle dependence of reflectivity which can be seen in a flat dielectric multi-layered film without the roughness is not seen and the reflectivity can be enhanced as a result. This improves the light extraction efficiency.

Figure 9:
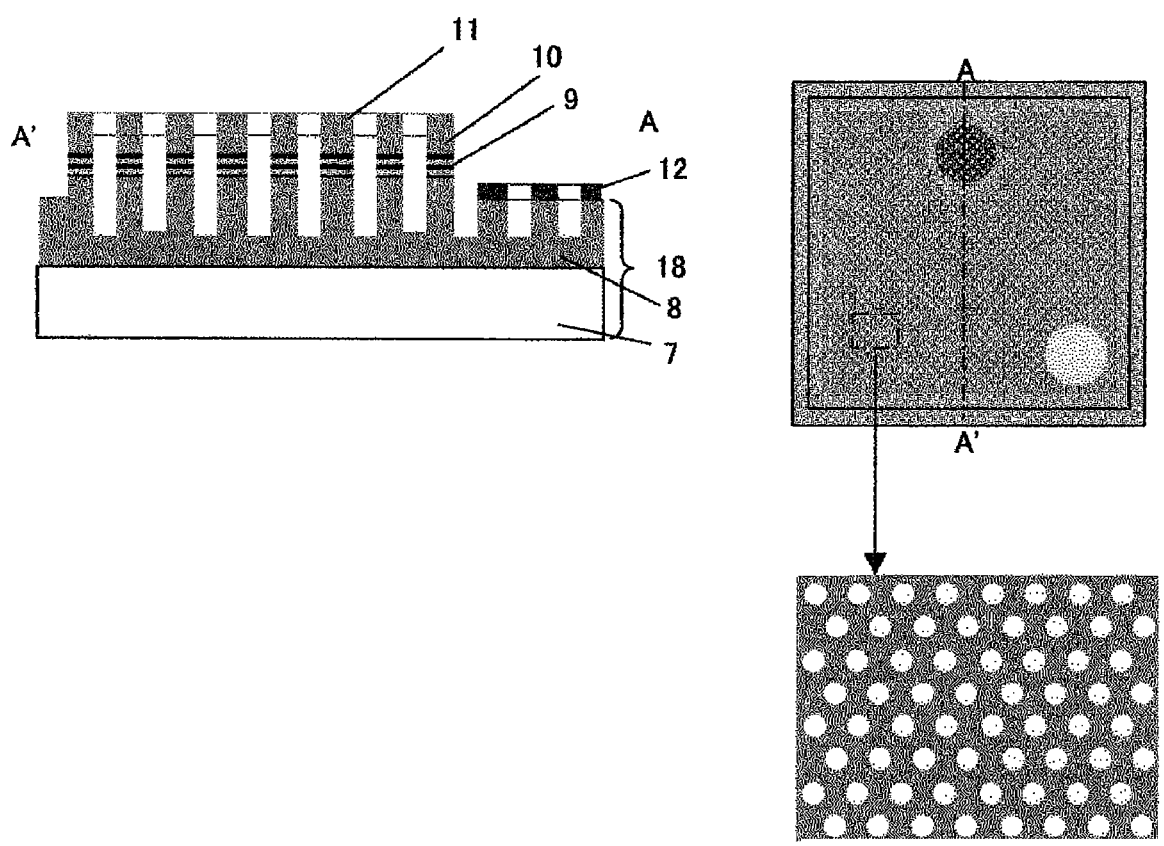
FIG. 9 shows a structure of a light emitting device according to the present invention.

The light emitting device in FIG. 9 is obtained by regrowing the GaN-based semiconductor crystal under a condition that lateral crystal growth is restrained after the structure with the circular-hole arrangement is formed on the surface of the GaN crystal grown on the sapphire. The light emitting device in FIG. 9 is obtained by growing the n-type layer, the light emitting layer, and the p-type layer at the time of regrowth and forming the structure with the circular-hole arrangement in the portion of the light emitting layer. The structure having the circular-hole arrangement in the light emitting layer is an ideal structure of the two-dimensional photonic crystal and significantly contributes to the improvement in light extraction efficiency. This light emitting device may be fabricated not by using etching which may give damage to the light emitting layer but by continuously regrowing the structure with the circular-hole arrangement. The light emitting device has high light output without damage to the light emitting layer.

EXAMPLE

The present invention will be described by using examples. However, the present invention is not limited thereto.

Example 1

Formation of Structure with Circular-Hole Arrangement on GaN Layer (Formation of Single Particle Layer)

Figure 10:
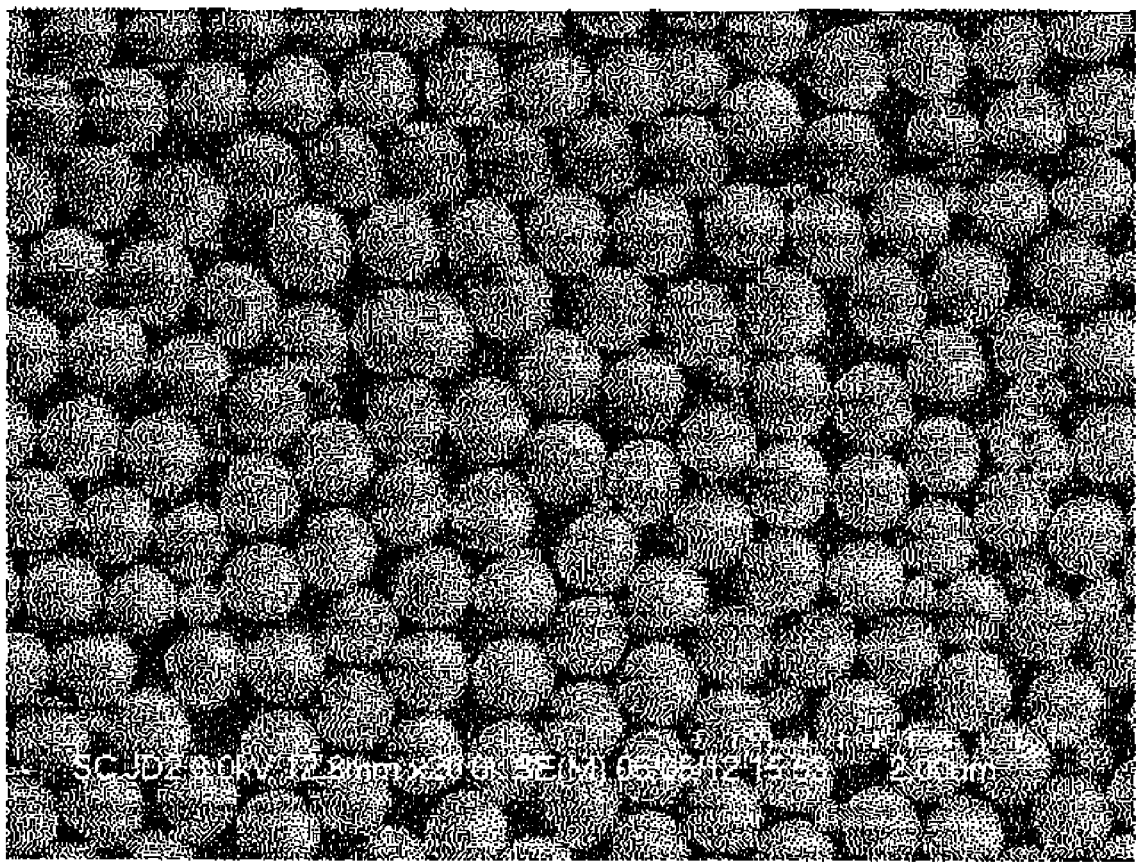
FIG. 10 shows a single particle film of particles in Example 1.

As an inorganic particle, a silica particle contained in a colloidal silica slurry (product name: PM-4540™ manufactured by Nissan Chemical Industries, Ltd., a first particle diameter: 450 nm, a particle concentration: 40% by weight) was used. A GaN layer was crystal-grown on a sapphire substrate by MOCVD. With the obtained substrate loaded on a spinner, the colloidal silica slurry diluted to 25% by weight was applied on the GaN layer and was spin-dried. A SEM picture of the substrate surface was shown in FIG. 10. A silica single particle layer was formed on the GaN layer. In addition, a two-dimensional closest packing structure was partially formed.

A pattern was formed on the substrate by normal photolithography using a photo-resist. By processing a portion which is not covered with the photo-resist with buffered hydrofluoric acid, the silica particle in the portion was removed. By removing the photo-resist by using acetone, a single particle layer having the structure of a silica particle arrangement only in the portion of the pattern which was covered with the photo-resist was obtained.

(First Etching)

The substrate formed with the single particle layer was loaded in ICP plasma etching apparatus (product name: RIE200iPT™ manufactured by SAMCO, Inc.), and etching was performed with respect to the silica particle to reduce the particle diameter under conditions shown below.

Etching gas: $CHF_3$ gas

ICP power: 200 W

BIAS power: 100 W

Chamber pressure: 0.8 Pa $CHF_3$ flow rate: 100 sccm

Etching time: 250 seconds

Figure 11:
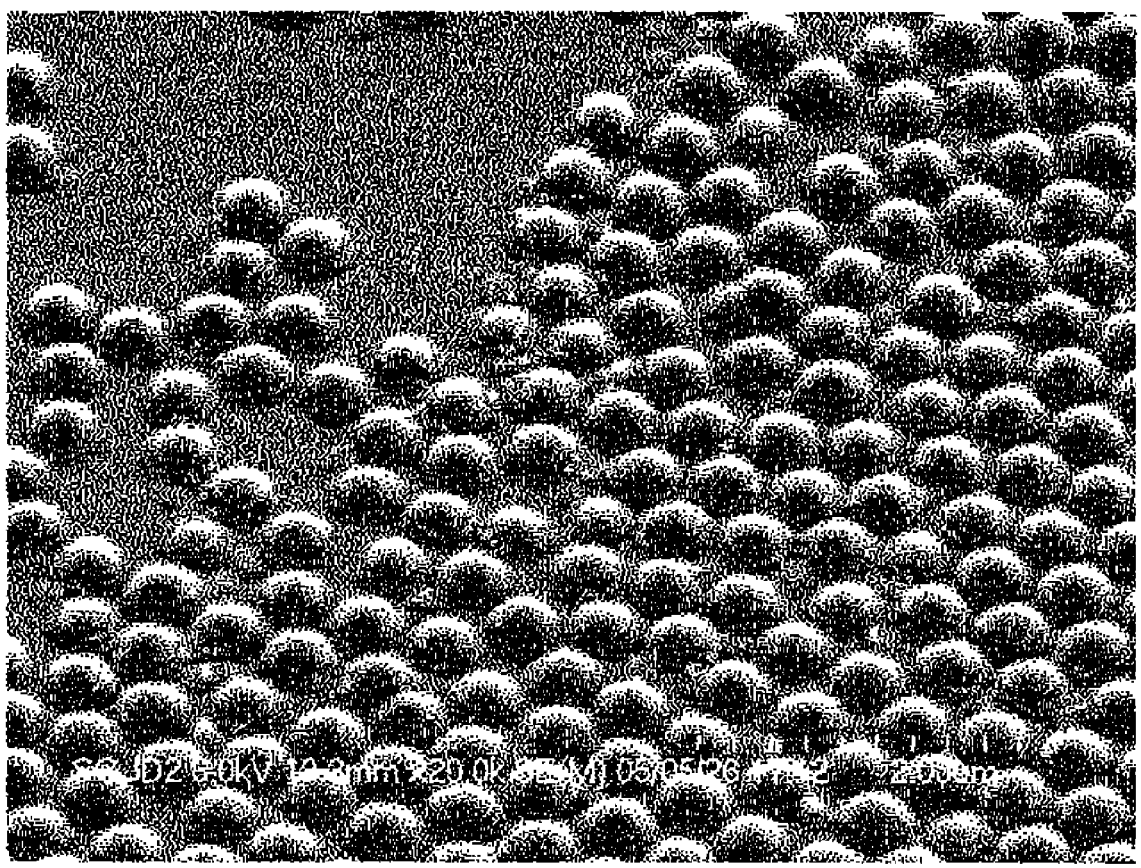
FIG. 11 is a perspective view showing a state after a first etching in Example 1.

The SEM picture of the substrate was shown in FIG. 11. The silica particle was in the configuration of a flattened particle with the diameter in a direction parallel with the substrate (=lateral direction) of 270 nm (60% of the original particle diameter) and the height of 90 nm (20% of the original particle diameter). The ratio (selectivity) between etching rates for the silica particle and GaN was 4.5. In addition, the portion of a two-dimensional closest packing structure had a two-dimensional photonic crystal structure where the particles were spaced apart at equal intervals.

Figure 12:
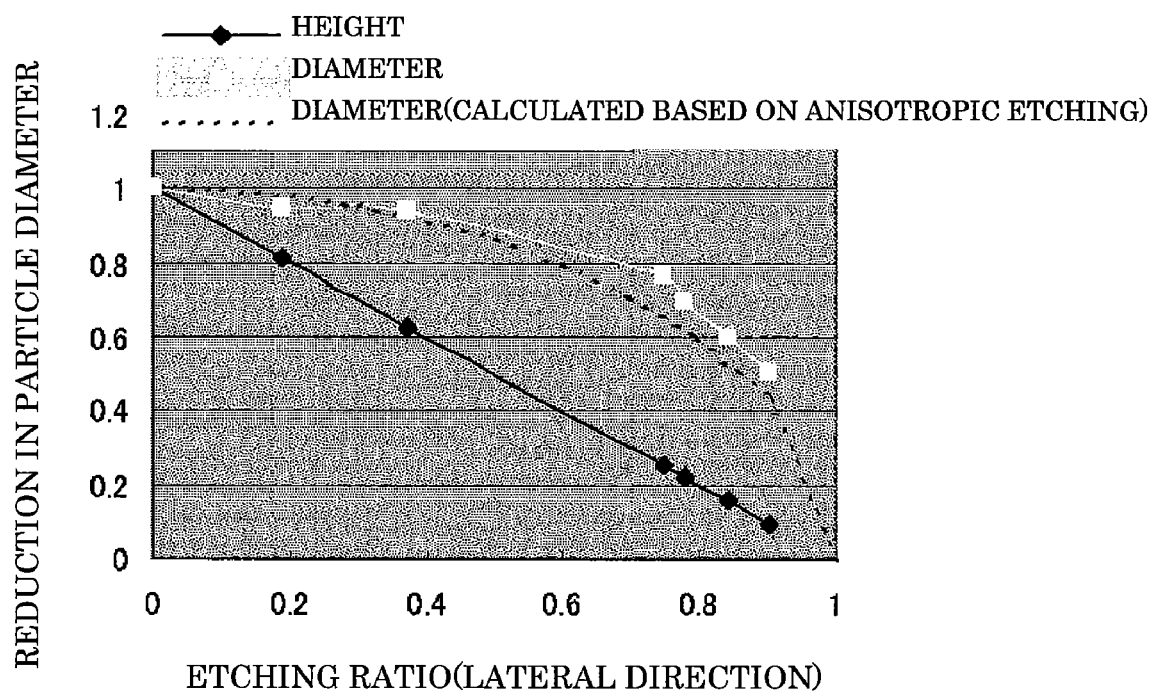
FIG. 12 shows the relationship between the first etching time and a reduction in a particle diameter in Example 1.

By changing the etching time for the same substrate, etching-time dependences of the change in the height and the change in the diameter in the lateral direction of the silica particle were examined. The result was shown in FIG. 12. The etching-time dependences of the height and the diameter in the lateral direction of the particle are similar to the result of anisotropic etching.

(Formation of Mask)

A Ni film with a thickness of 40 nm was formed by an electron beam vacuum deposition method on the entire surface of the substrate. 40 nm in the thickness of the Ni film corresponds to 44% of 90 nm in the height of the silica particle.

Figure 13:
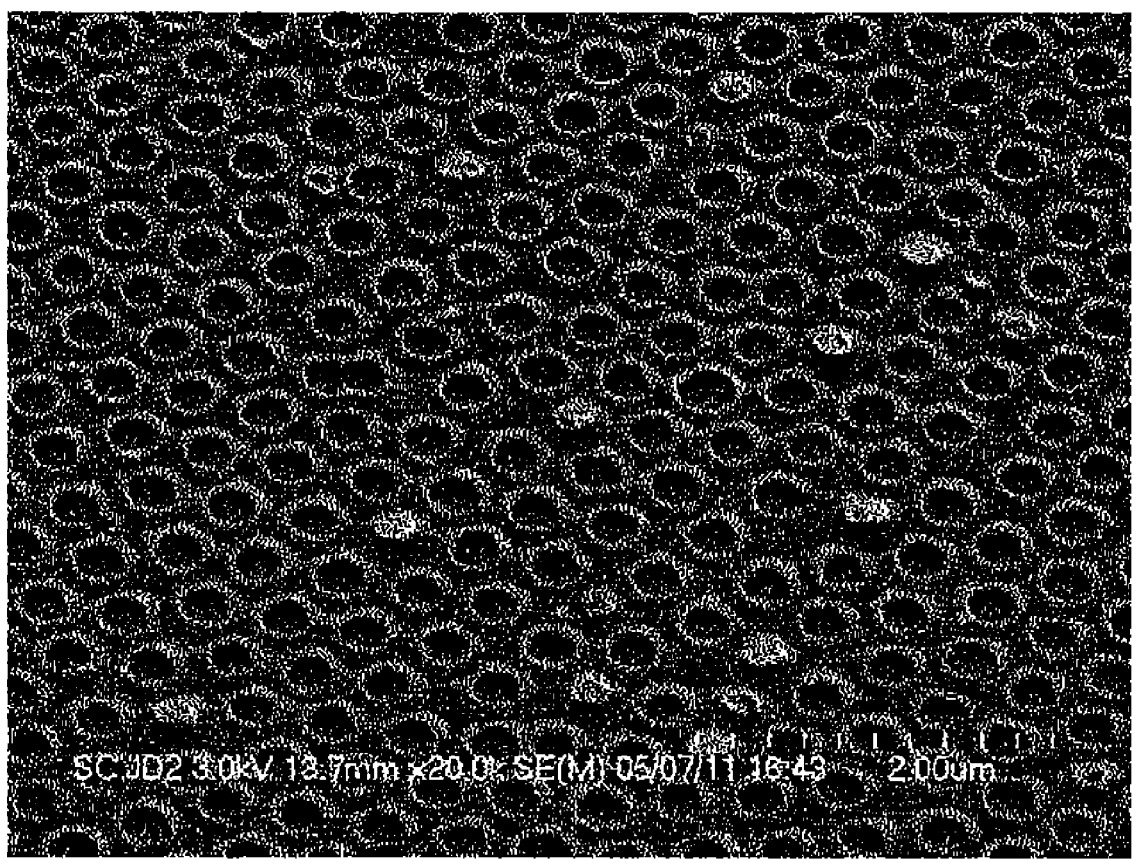
FIG. 13 shows a mask after a particle lift-off process in Example 1.

After the substrate was immersed in a tetramethylammonium aqueous solution of a pH 14 at 60° C. for 10 minutes, by lifting off the silica particle with an ultrasonic process, a Ni mask with a large number of holes each having an inner diameter equal to the diameter of the silica particle of 270 nm was obtained. The SEM picture of the Ni mask was shown in FIG. 13.

(Second Etching)

The obtained substrate was loaded in the ICP plasma etching apparatus, and etching was performed with respect to the GaN layer under conditions shown below.

Figure 14:
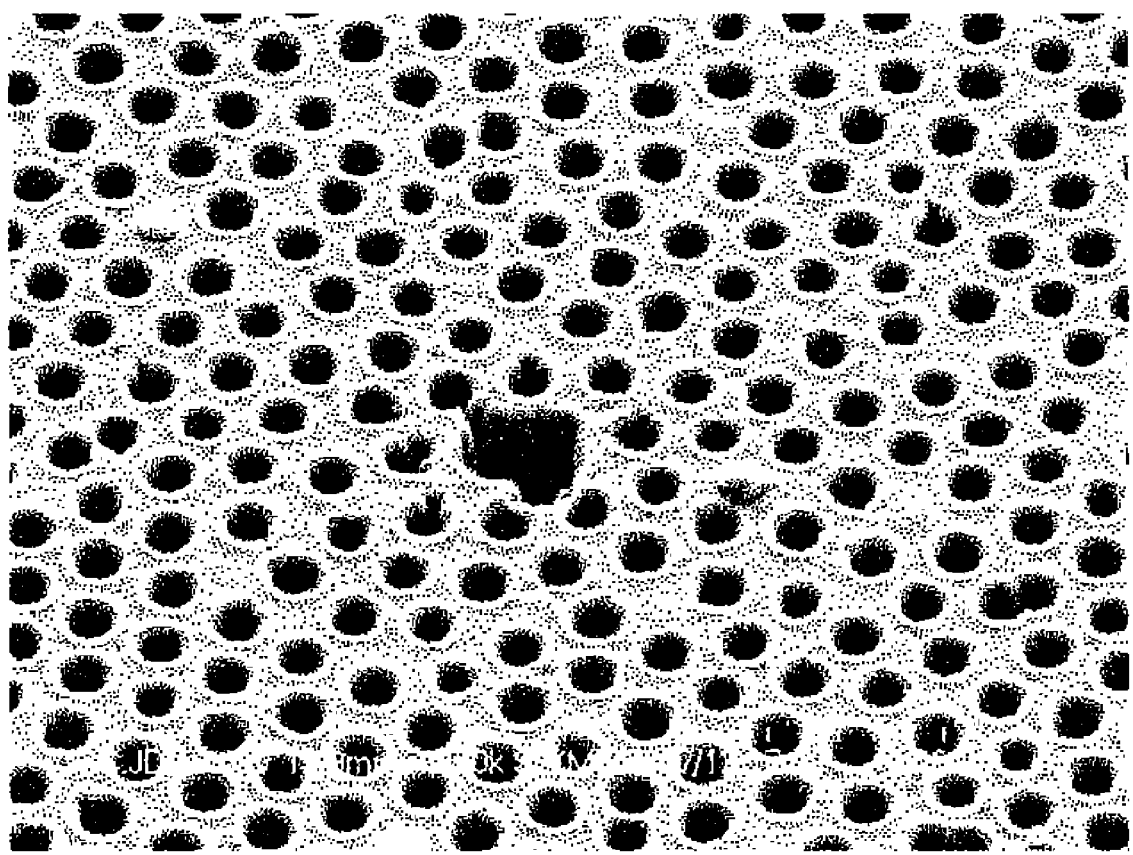
FIG. 14 shows a substrate surface after a second etching in Example 1.
Figure 15:
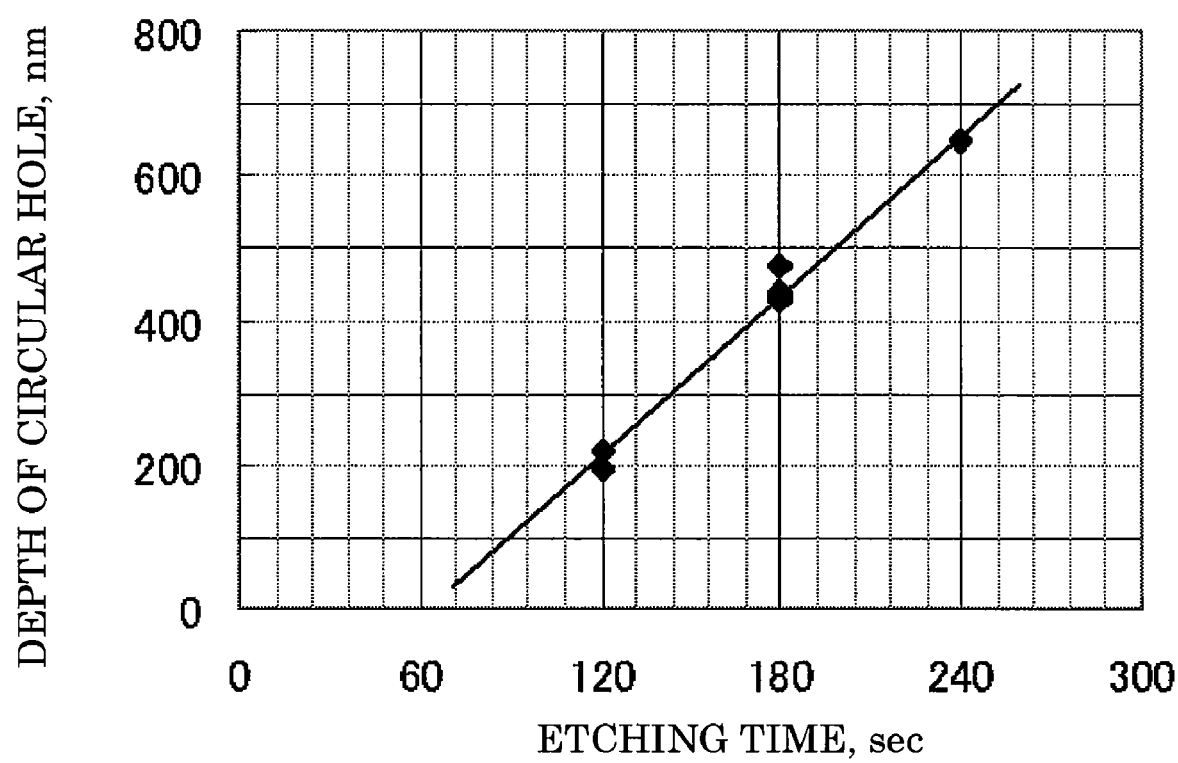
FIG. 15 shows the relationship between the second etching time and a depth of a circular hole in Example 1.

Etching gas: $Cl_2$ gas
ICP power: 100 W
BIAS power: 100 W
Chamber pressure: 0.3 Pa
$Cl_2$ flow rate: 10 sccm
Etching time: 240 seconds The SEM picture of the surface of the GaN layer is shown in FIG. 14. As shown in FIG. 14, the structure with the circular-hole arrangement having the aspect ratio of not less than 2 was formed. The ratio (selectivity) between etching rates for GaN and Ni was about 10. the etching-time dependence of the depth of the hole was shown in FIG. 15. As shown in FIG. 15, the depth of the hole and the etching time exhibited excellent linearity.

Example 2

Formation of Structure with Circular-Hole Arrangement on Sapphire

By performing the same operations as in (Formation of Single Particle Layer), (First Etching), (Formation of Mask), and (Second Etching) in Example 1 except for the use of a C-face sapphire substrate as a substrate, the structure with the circular-hole arrangement was formed on the sapphire substrate.

The etch rate for sapphire was almost 0. The selectivity (silica/sapphire) in the first etching was high. The selectivity (Ni mask/sapphire) in the second etching was 5.

Example 3

Formation of Structure with Circular-Hole Arrangement on ITO (an Ohmic p-Electrode of a Light Emitting Diode)

By forming, on the sapphire, a light emitting device structure composed of the GaN-based semiconductor layer by MOCVD, then an ITO thin film with a thickness of 150 nm in accordance with a facing target sputtering method by performing etching to expose an n-layer, and an ohmic p-electrode pattern by photolithography, a multi-layered substrate was obtained.

By performing the same operations as in (Formation of Single Particle Layer), (First Etching), (Formation of Mask), and (Second Etching) in Example 1 except for the use of the multi-layered substrate as a substrate, the structure with the circular-hole arrangement was formed on the ITO. Next, by removing the Ni mask with buffered hydrofluoric acid and forming an Al ohmic n-electrode on the n-layer exposed portion, the light emitting device was obtained.

The etch rate for ITO in the first etching was almost 0 and the selectivity (silica/ITO) was high. In the second etching, the selectivity (Ni mask/ITO) was 5. By performing the same operations except that the second etching time was changed to 3 minutes or 6 minutes, a light emitting device I having the depth of the hole reaching the inside of the ITO thin film and a light emitting device II having the depth of the hole reaching the p-type GaN layer were obtained. The light emitting properties for the light emitting devices were examined with an forward current of 20 mA. The light output of the light emitting device I was 1.18 times and the light output of the light emitting device was 1.24 times when compared with a light emitting device in which the roughness was not formed on the ITO thin film p-electrode. Thus, in the second etching, the depth of the hole to be formed can be adjusted by the etching time and it was possible to have the hole reaching up to the inside of the ITO thin film or the hole extending through the ITO thin film and reaching the GaN-based semiconductor layer. In the latter case, the ITO thin film as the p-electrode has a structure completely covering the entire surface of the GaN-based semiconductor layer except holes, and was found to be excellent as a surface electrode having the circular-hole arrangement.

Example 4

Formation of Structure with Circular-Hole Arrangement on GaN in Peripheral Portion of Mesa in Light Emitting Diode Except for the formation of the structure with the circular-hole arrangement on the entire outside surface of the p-electrode in place of the ohmic p-electrode, and the second etching time set to 3 minutes, a light emitting device was obtained by performing the same operations as in Example 3. The light emitting device was formed with the structure with the circular-hole arrangement having the depth of 0.65 μm. The light emitting property of the light emitting device was examined with a forward current of 20 mA. The light output of the light emitting device was 1.64 times when compared with the light emitting device in which the structure with the circular-hole arrangement was not formed. The portion outside the p-electrode corresponds to the peripheral portion of a mesa trapezoid portion and the n-layer exposed portion not covered with the n-electrode which are made of the nitride semiconductor. The selectivity in the first etching was equal to that in Example 1. The selectivity in the second etching was 10. Since the selectivity is high compared with the case with ITO in Example 3, a deep hole with high aspect ratio can be formed.

INDUSTRIAL APPLICABILITY

In accordance with the present invention, a periodic or random roughness structure of the circular-hole arrangement type having a size of approximately 10 nm to 1 μm can be formed in a large area of a required pattern region with excellent reproducibility. In addition, in accordance with the present invention, a light emitting device having the roughness structure on a light extraction surface or an opposing surface is provided. The light emitting device is excellent in a light extraction efficiency.

The invention claimed is:

1. A method for fine processing of a substrate which comprises, after removing a single particle layer from the substrate having the single particle layer, forming a hole having an inner diameter smaller than a diameter of a particle and centering on a position on the substrate where each particle constructing the single particle layer has been placed is formed by etching.

2. A method for fabrication of a substrate, comprising the following successive steps of (I) to (V):
  (I) forming a single particle layer by arranging particles on the substrate;
  (II) reducing a diameter of each of the particles by etching the obtained substrate;
  (III) forming a thin film composed of a mask material on the obtained substrate;
  (IV) removing the particle from the substrate and forming a mask having a hole with an inner diameter equivalent to the diameter of the particle at the position where the individual particle has existed; and
  (V) forming a hole with the diameter equivalent to the inner diameter of the hole of the mask on the substrate below the hole of the mask by etching the substrate using the mask.

3. The method of claim 1 or 2, wherein the substrate in the step (I) is made of at least one selected from a semiconductor, a dielectric, a light-transmitting (conductive) material, and a metal.

4. The method of claim 3, wherein the semiconductor is made of a nitride.

5. The method of claim 3, wherein the substrate is made of the semiconductor and the light-transmitting (conductive) material.

6. The method of claim 3, wherein the light-transmitting material is made of ITO.

7. The method of claim 3, wherein the substrate is made of the semiconductor and the metal.

8. The method of claim 1 or 2, wherein each of the particles in the step (I) is made of an inorganic substance or a organic substance.

9. The method of claim 8, wherein the inorganic substance is made of at least one selected from an oxide, a nitride, a carbide, a boride, a sulfide, and a metal.

10. The method of claim 9, wherein the oxide is silica.

11. The method of claim 8, wherein the organic substance is a polymeric material.

12. The method of claim 11, wherein the polymeric material is polystyrene.

13. The method of claim 2, wherein the formation in the step (I) is performed by a advection and accumulation method, a dip-coating method, or a spin coating method.

14. The method of claim 2, wherein the etching in the step (II) is performed using a gas containing fluorine or a gas containing oxygen as an etching gas.

15. The method of claim 14, wherein the gas containing fluorine is at least one selected from $CF_4$, $CHF_3$, $C_2H_2F_2$, and $C_2F_3Cl_3$.

16. The method of claim 2, wherein the etching in the step (II) is performed by an anisotropic etching having a selectivity (=etching rate for the particle/etching rate for the substrate) of not less than 1.

17. The method of claim 2, wherein the etching in the step (II) is performed under a condition that the particle has the diameter corresponding to not less than 10% and not more than 95% of the particle diameter before the etching.

18. The method of claim 2, wherein the etching in the step (II) is performed under a condition that the particle is flattened.

19. The method of claim 2, wherein the mask material in the step (III) satisfies that a selectivity (=etching rate for the substrate/etching rate for the mask) of the etching in the step (V) is not less than 1.

20. The method of claim 2, wherein the mask material is Ni.

21. The method of claim 2, wherein the formation of the mask in the step (III) is performed by a vapor phase deposition method, a vacuum deposition method, an ion beam sputtering method, or a laser ablation method.

22. The method of claim 2, wherein the formation of the mask in the step (III) is performed by depositing the mask to a thickness of not more than 50% of a height of the particle having the reduced particle diameter at an incident angle of a particle of the mask material which is adjusted to be generally perpendicular to a surface of the substrate.

23. The method of claim 2, wherein the removal in the step (IV) is performed using an etching liquid which is excellent in particle solubility and poor in mask solubility.

24. The method of claim 2, wherein each of the particles in the step (I) is made of silica, the substrate is made of a nitride or ITO, and the etching in the step (II) is performed under a condition that an etching gas is a gas containing fluorine.

25. The method of claim 2, wherein each of the particles in the step (I) is made of a polymeric material, the substrate is made of a metal or ITO, and the etching in the step (II) is performed under a condition that an etching gas is a gas containing oxygen.

26. The method of claim 2, wherein each of the particles in the step (I) is made of silica, the mask material in the step (III) is Ni, and the etching in the step (V) is performed by using a wet process and an ultrasonic process in combination under conditions that an etching liquid is an alkaline liquid having a pH of not less than 12 and a temperature is not less than 50° C.

27. The method of claim 2, wherein each of the particles in the step (I) is made of a polymeric material, the mask material in the step (III) is made of a metal, and the etching in the step (V) is performed under a condition that an etching liquid is an organic solvent.

* * * * *